US012469754B2

(12) United States Patent
Salmon

(10) Patent No.: US 12,469,754 B2
(45) Date of Patent: Nov. 11, 2025

(54) HERMETIC MICROELECTRONIC MODULE USING A SHEATH

(71) Applicant: Peter C. Salmon, Mountain View, CA (US)

(72) Inventor: Peter C. Salmon, Mountain View, CA (US)

(*) Notice: Subject to any disclaimer, the term of this patent is extended or adjusted under 35 U.S.C. 154(b) by 0 days.

(21) Appl. No.: 18/806,478

(22) Filed: Aug. 15, 2024

(65) Prior Publication Data

US 2025/0087540 A1   Mar. 13, 2025

Related U.S. Application Data

(60) Provisional application No. 63/537,168, filed on Sep. 7, 2023.

(51) Int. Cl.
| | |
|---|---|
| *H01L 23/04* | (2006.01) |
| *H01L 21/52* | (2006.01) |
| *H01L 23/36* | (2006.01) |
| *H01L 25/00* | (2006.01) |
| *H05K 7/20* | (2006.01) |

(52) U.S. Cl.
CPC ............ *H01L 23/041* (2013.01); *H01L 21/52* (2013.01); *H01L 23/36* (2013.01); *H05K 7/20236* (2013.01); *H05K 7/20772* (2013.01); *H01L 25/00* (2013.01)

(58) Field of Classification Search
CPC ......... H01L 23/041; H01L 23/36–3738; H01L 25/00–18; H01L 21/52; H05K 7/20218–20281; H05K 7/20772; H05K 7/20763
See application file for complete search history.

(56) References Cited

U.S. PATENT DOCUMENTS

| | | |
|---|---|---|
| 4,114,275 A | 9/1978 | Jones et al. |
| 4,124,338 A | 11/1978 | Mitchell |
| 4,169,262 A | 9/1979 | Schwartz et al. |
| 4,259,676 A | 3/1981 | Salmon |
| 4,309,365 A | 1/1982 | Van Ness et al. |
| 4,341,518 A | 7/1982 | Wallace |
| 4,366,802 A | 1/1983 | Goodine et al. |

(Continued)

OTHER PUBLICATIONS

Birbarah et al., Water Immersion Cooling of High Power Density Electronics, International Journal of Heat and Mass Transfer, 2020, vol. 147, 13 pages.

(Continued)

*Primary Examiner* — Sue A Purvis
*Assistant Examiner* — Aneta B Cieslewicz
(74) *Attorney, Agent, or Firm* — Jennifer Hayes; Nixon Peabody LLP

(57) ABSTRACT

A hermetic microelectronic module includes a substrate having redistribution layers fabricated thereon, a plurality of electronic components mounted on the substrate to create an electronic assembly, and a sheath enclosing the electronic assembly except for an opening at the top for making electrical connections. The sheath may take several physical forms, and backside power distribution may be employed. 3D features may be employed on the sheath surface to increase the convective heat transfer coefficient. A computer server includes an array of hermetic microelectronic modules partially immersed in a tank of water.

19 Claims, 13 Drawing Sheets

(56) References Cited

U.S. PATENT DOCUMENTS

| | | | |
|---|---|---|---|
| 4,419,300 A | 12/1983 | Van Ness et al. |
| 4,534,803 A | 8/1985 | Asano et al. |
| 4,551,787 A | 11/1985 | Mittal et al. |
| 4,585,293 A | 4/1986 | Czeschka et al. |
| 4,669,529 A | 6/1987 | Evertz |
| 4,677,528 A | 6/1987 | Miniet |
| 4,733,256 A | 3/1988 | Salmon |
| 4,765,400 A | 8/1988 | Chu et al. |
| 4,777,500 A | 10/1988 | Salmon |
| RE32,897 E | 3/1989 | Salmon |
| 4,928,207 A | 5/1990 | Chrysler et al. |
| 4,973,247 A | 11/1990 | Varnes et al. |
| 4,975,058 A | 12/1990 | Woodward |
| 4,978,548 A | 12/1990 | Cope et al. |
| 4,993,229 A | 2/1991 | Baus et al. |
| 5,028,988 A | 7/1991 | Porter et al. |
| 5,030,976 A | 7/1991 | Salmon |
| 5,074,787 A | 12/1991 | Tsukada |
| 5,088,924 A | 2/1992 | Woodward |
| 5,145,370 A | 9/1992 | Woodward |
| 5,153,617 A | 10/1992 | Salmon |
| 5,155,661 A | 10/1992 | Nagesh et al. |
| 5,214,570 A | 5/1993 | Shah et al. |
| 5,283,446 A | 2/1994 | Tanisawa |
| 5,287,127 A | 2/1994 | Salmon |
| 5,323,292 A | 6/1994 | Brzezinski |
| 5,400,062 A | 3/1995 | Salmon |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,055,157 A | 4/2000 | Bartilson |
| 6,126,099 A | 10/2000 | Fachinger et al. |
| 6,126,883 A | 10/2000 | Troetscher et al. |
| 6,210,262 B1 | 4/2001 | Burch et al. |
| 6,251,466 B1 | 6/2001 | Mcguire et al. |
| 6,309,049 B1 | 10/2001 | Salmon |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,881,609 B2 | 4/2005 | Salmon |
| 6,882,533 B2 | 4/2005 | Bash et al. |
| 6,890,799 B2 | 5/2005 | Daikoku et al. |
| 6,927,471 B2 | 8/2005 | Salmon |
| 7,069,737 B2 | 7/2006 | Wang et al. |
| 7,144,792 B2 | 12/2006 | Wilmot et al. |
| 7,163,830 B2 | 1/2007 | Salmon |
| 7,240,500 B2 | 7/2007 | Bash et al. |
| 7,254,024 B2 | 8/2007 | Salmon |
| 7,297,572 B2 | 11/2007 | Salmon |
| 7,408,258 B2 | 8/2008 | Salmon |
| 7,415,289 B2 | 8/2008 | Salmon |
| 7,427,809 B2 | 9/2008 | Salmon |
| 7,455,094 B2 | 11/2008 | Lee et al. |
| 7,505,862 B2 | 3/2009 | Salmon |
| 7,535,107 B2 | 5/2009 | Salmon |
| 7,586,747 B2 | 9/2009 | Salmon |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,252,635 B2 | 8/2012 | Salmon |
| 8,369,091 B2 | 2/2013 | Campbell |
| 8,457,806 B2 | 6/2013 | Shah |
| 8,685,833 B2 | 4/2014 | Khanna et al. |
| 8,780,552 B2 | 7/2014 | El-Essawy |
| 8,787,015 B2 | 7/2014 | El-Essawy |
| 8,842,688 B2 | 9/2014 | Vahdat |
| 8,922,511 B1 | 12/2014 | Salmon |
| 9,059,070 B2 | 6/2015 | Salmon |
| 9,061,893 B1 | 6/2015 | Minervini |
| 9,095,942 B2 | 8/2015 | Campbell |
| 9,142,533 B2 | 9/2015 | Shen et al. |
| 9,214,416 B1 | 12/2015 | Furnival |
| 9,227,220 B1 | 1/2016 | Salmon |
| 9,250,024 B2 | 2/2016 | Campbell |
| 9,257,751 B2 | 2/2016 | Felic et al. |
| 9,386,685 B2 | 7/2016 | Bonkohara |
| 9,493,102 B2 | 11/2016 | Tang et al. |
| 9,576,409 B2 | 2/2017 | Salmon |
| 9,633,771 B2 | 4/2017 | Salmon |
| 9,761,620 B1 | 9/2017 | Salmon |
| 9,773,755 B2 | 9/2017 | Shen et al. |
| 9,874,923 B1 | 1/2018 | Brown |
| 10,039,210 B2 | 7/2018 | Wong |
| 10,249,503 B2 | 4/2019 | Yoon et al. |
| 10,336,599 B2 | 7/2019 | Miles |
| 10,461,009 B2 | 10/2019 | Hung et al. |
| 10,481,650 B2 | 11/2019 | Saito |
| 10,613,603 B2 | 4/2020 | Bose |
| 10,624,236 B2 | 4/2020 | Inano |
| 10,701,832 B2 | 6/2020 | Chainer et al. |
| 10,757,833 B2 | 8/2020 | Bodenweber |
| 10,910,364 B2 | 2/2021 | Or-Bach |
| 10,966,338 B1 | 3/2021 | Salmon |
| 11,064,626 B1 | 7/2021 | Salmon |
| 11,138,103 B1 | 10/2021 | Shi |
| 11,379,254 B1 | 7/2022 | Karumbunathan |
| 11,393,807 B2 | 7/2022 | Salmon |
| 11,417,582 B2 | 8/2022 | Chen et al. |
| 11,445,640 B1 | 9/2022 | Salmon |
| 11,523,543 B1 | 12/2022 | Salmon |
| 11,546,991 B2 | 1/2023 | Salmon |
| 11,646,242 B2 | 5/2023 | Costa et al. |
| 11,670,618 B2 | 6/2023 | Yang et al. |
| 11,692,271 B2 | 7/2023 | Miljkovic et al. |
| 11,856,727 B2 | 12/2023 | Monteserin |
| 12,136,576 B1 | 11/2024 | Salmon |
| 12,255,122 B1 | 3/2025 | Salmon |
| 2001/0042777 A1 | 11/2001 | Kyomasu et al. |
| 2003/0000552 A1 | 1/2003 | Bratten et al. |
| 2003/0151130 A1 | 8/2003 | Cheon |
| 2005/0126766 A1* | 6/2005 | Lee ................. B82Y 10/00 |
| | | 165/185 |
| 2005/0240812 A1 | 10/2005 | Anderson |
| 2005/0254214 A1* | 11/2005 | Salmon ............. H01L 23/473 |
| | | 361/699 |
| 2005/0255722 A1* | 11/2005 | Salmon ............. H01L 25/165 |
| | | 257/E25.031 |
| 2006/0244926 A1 | 11/2006 | Shih et al. |
| 2007/0007983 A1 | 1/2007 | Salmon |
| 2007/0074853 A1 | 4/2007 | Popovich |
| 2007/0176298 A1 | 8/2007 | Osone |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2011/0302346 A1 | 12/2011 | Vahdat |
| 2012/0165908 A1 | 6/2012 | Kou et al. |
| 2012/0217772 A1 | 8/2012 | Tang |
| 2013/0015578 A1 | 1/2013 | Thacker |
| 2013/0228898 A1 | 9/2013 | Ide |
| 2014/0123492 A1 | 5/2014 | Campbell |

(56) References Cited

U.S. PATENT DOCUMENTS

| | | |
|---|---|---|
| 2014/0137581 A1 | 5/2014 | Cho |
| 2015/0199858 A1 | 7/2015 | Salmon |
| 2016/0013148 A1 | 1/2016 | Lin et al. |
| 2016/0081227 A1 | 3/2016 | Lee |
| 2016/0088756 A1 | 3/2016 | Ramadas |
| 2016/0155682 A1 | 6/2016 | Ahuja et al. |
| 2017/0015477 A1 | 1/2017 | Miles |
| 2017/0254574 A1 | 9/2017 | Kim |
| 2017/0292782 A1 | 10/2017 | Joyer et al. |
| 2017/0308133 A1 | 10/2017 | Soffer |
| 2017/0354061 A1 | 12/2017 | Saito |
| 2018/0170744 A1 | 6/2018 | Petersen et al. |
| 2018/0293017 A1 | 10/2018 | Curley |
| 2018/0315730 A1 | 11/2018 | Gill et al. |
| 2018/0320937 A1 | 11/2018 | Deng et al. |
| 2019/0041104 A1 | 2/2019 | Yin |
| 2019/0041105 A1 | 2/2019 | Yin |
| 2019/0286373 A1 | 9/2019 | Karumbunathan et al. |
| 2019/0363196 A1 | 11/2019 | Wood |
| 2019/0377391 A1 | 12/2019 | Chen |
| 2020/0022601 A1 | 1/2020 | Rogers |
| 2020/0027809 A1 | 1/2020 | Hung et al. |
| 2020/0029465 A1 | 1/2020 | Chainer |
| 2020/0089293 A1 | 3/2020 | Enright |
| 2020/0091111 A1 | 3/2020 | Lee et al. |
| 2020/0093038 A1 | 3/2020 | Enright |
| 2020/0243429 A1 | 7/2020 | Lai et al. |
| 2020/0310394 A1 | 10/2020 | Wouhaybi |
| 2020/0328139 A1 | 10/2020 | Chiu |
| 2021/0102294 A1 | 4/2021 | Miljkovic et al. |
| 2021/0343690 A1 | 11/2021 | Salmon |
| 2022/0087048 A1 | 3/2022 | Enright |
| 2022/0113784 A1 | 4/2022 | Alben et al. |
| 2022/0217845 A1 | 7/2022 | Salmon |
| 2022/0328427 A1 | 10/2022 | Coppola et al. |
| 2023/0088049 A1 | 3/2023 | Salmon |
| 2023/0180439 A9 | 6/2023 | Enright |
| 2023/0276600 A1 | 8/2023 | Salmon |
| 2023/0332293 A1 | 10/2023 | Miljkovic et al. |
| 2023/0380101 A1 | 11/2023 | Sullivan |
| 2023/0413466 A1 | 12/2023 | Heydari |
| 2024/0164064 A1 | 5/2024 | Salmon |

OTHER PUBLICATIONS

Gebrael et al., High-Efficiency Cooling via the Monolithic Integration of Copper on Electronic Devices, Nature Electronics, 2022, vol. 5, pp. 394-402.

* cited by examiner

120

| Part | A mm² | t mm | P W | σ_th W/m°C | θ °C/W | h W/m²°C | ΔT °C |
|---|---|---|---|---|---|---|---|
| HPC chip | 814 | 0.2 | 1,000 | 149 | 0.00165 | | 1.649 |
| AlN filler (Maruwa) | 814 | 0.2 | 1,000 | 180 | 0.00137 | | 1.365 |
| Copper casting | 814 | 1.0 | 1,000 | 390 | 0.00315 | | 3.150 |
| Nickel plating | 7,245 | 0.006 | 1,000 | 91 | 0.00001 | | 0.009 |
| Water Interface | 7,245 | | 1,000 | | 0.00690 | 20,000 | 6.901 |
| | | | | | 0.01307 | | 13.074 |

FIG. 13

HERMETIC MICROELECTRONIC MODULE USING A SHEATH

RELATED APPLICATIONS

This application claims the benefit of and priority under 35 U.S.C. § 119 (e) to U.S. provisional patent application No. 63/537,168 filed Sep. 7, 2023, the entirety of which is hereby incorporated by reference.

This application is related to U.S. Pat. No. 10,966,338, filed Mar. 11, 2020, U.S. Pat. No. 11,064,626, filed Oct. 14, 2020, U.S. Pat. No. 11,393,807, filed Jul. 8, 2021, U.S. Pat. No. 11,546,991, filed Mar. 2, 2022, and U.S. patent application Ser. No. 17/989,549, filed Nov. 17, 2022, each entitled "DENSELY PACKED ELECTRONIC SYSTEMS," and each hereby incorporated by reference in their entireties.

This application is also related to U.S. Pat. No. 11,445,640, filed Feb. 25, 2022, U.S. Pat. No. 11,523,53, filed May 6, 2022, and U.S. patent application Ser. No. 17/982,393, filed Nov. 7, 2022, each entitled "WATER COOLED SERVER," and each hereby incorporated by reference in their entireties.

This application is also related to U.S. patent application Ser. No. 18,607,807, entitled "MICROELECTRONIC MODULE," the entirety of which is hereby incorporated by reference.

FIELD

Embodiments of the application relate to electronic modules, and more particularly, to hermetic microelectronic modules that comprise a metal sheath.

BACKGROUND

Hermetic packages have been used to package chips and electronic assemblies for decades. However, these packages tend to be bulky and expensive, and they generally comprise a substantial thermal resistance from chip to cooling medium—which limits the overall thermal efficiency when deployed in a computer server for example.

SUMMARY

Embodiments herein disclose a hermetic microelectronic module comprising a substrate with redistribution layers (RDLs), electronic components mounted on the substrate forming an electronic assembly, and a metal sheath enclosing the assembly except for an opening to facilitate electrical connections. The metal sheath can take the form of a wrapped foil, or a casting. Alternatively, a portion of the sheath may be formed in a press, wherein uniform pressure and temperature are applied to a pair of thin metal plates that become parallel side plates of the sheath. Potential applications include water-cooled servers and supercomputers, inverter electronics for electronic vehicles or energy storage applications, wherein hermetic microelectronic modules are cooled by immersion in flowing water.

Additional embodiments disclose a method for planarizing and encapsulating a circuit assembly using a press with parallel platens, a mold cavity, thin metal plates, and electrically conductive or non-conductive filler. The method comprises steps of fitting the circuit assembly within the mold cavity, injecting the filler material, applying pressure and heat to cure the filler material, and soldering a bottom plate and end plates to create a hermetic module.

A technological advantage of the disclosed hermetic microelectronic modules is their ability to provide water-impermeable protection for electronic assemblies, enhancing reliability and longevity in demanding environments. Further, the disclosed method for planarization and encapsulation offers a cost-effective alternative to traditional grinding and polishing techniques, making it suitable for large-scale circuit boards. These technical advantages provide one or more technological advancements over prior art approaches.

Use of the proposed hermetic microelectronic modules in water-cooled servers, supercomputers, and inverters, can provide improved cooling performance, including lower junction temperatures for high-powered components, as well as improved energy efficiency. It is an objective of the present invention to produce a hermetic microelectronic module capable of effectively cooling a heat flux of more than 10 W/mm$^2$ at the back side of a flip-chip mounted component. It is a further objective of the present invention to achieve such cooling rates using single-phase water cooling, thereby avoiding the cost and complexity of two-phase cooling.

When compared with two-phase cooling, single-phase cooling avoids the complications of condensers, pumps that are required to operate with both liquid and gas phases, and mechanical stresses arising from substantial pressure changes. Single-phase cooling also enables the use of cooling water where the maximum water temperature is controlled to be around 60-75° C., leading to substantially lower junction temperatures than can be achieved with two-phase cooling where the coolant boils at 100° C. or higher unless a complex vacuum process is employed. In associated electronic systems, lower junction temperatures can result in more efficient transistor operation, higher performance per watt, and higher reliability.

BRIEF DESCRIPTION OF THE DRAWINGS

The accompanying drawings, which are incorporated into and constitute a part of this specification, illustrate examples of embodiments. The examples of embodiments, together with the description of example embodiments, explain the principles and implementations of the embodiments.

FIG. 9A is a perspective view of 3D surface features comprising posts, in an embodiment of the present disclosure.

FIG. 13 is a table that illustrates spreadsheet 120 used to calculate thermal performance for hermetic microelectronic module 100 depicted in FIG. 10.

DETAILED DESCRIPTION

Figure 1:
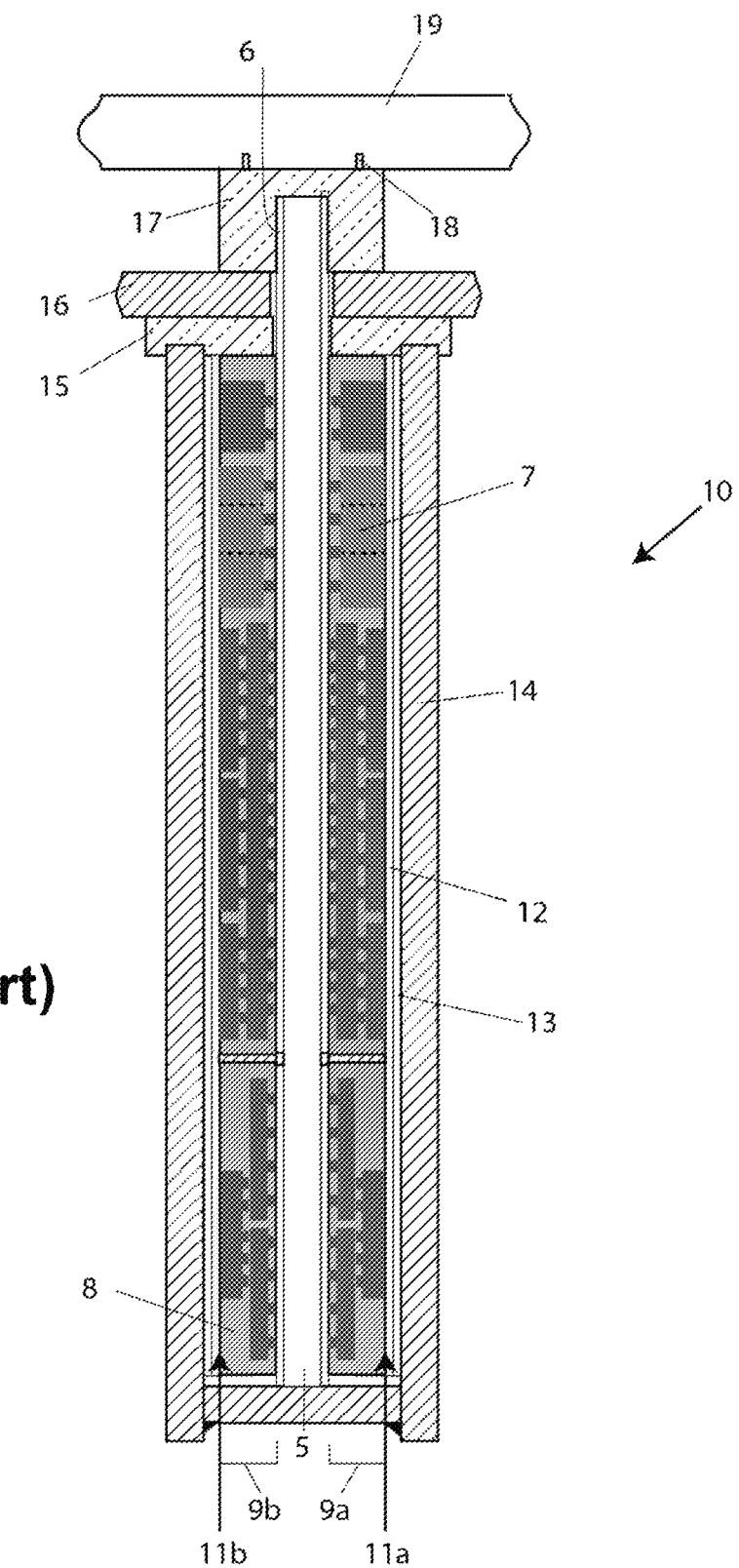
FIG. 1 illustrates a prior art microelectronic module that employs metal plates to create a water barrier.

FIG. 1 illustrates a prior art microelectronic module 10 described in co-pending U.S. patent application Ser. No. 17/982,393, with metal sheets 14 providing protection against intrusion of water. Metal sheets 14 are impermeable to water. Microelectronic module 10 includes a substrate 5 having redistribution layers (RDLs) 6 on each side. Semiconductor chips such as 7 are mounted on each side of substrate 5 and spaces between the chips are filled with a filler 8. Electronic assemblies 9a, 9b are ground and polished to form polished planar surfaces 11a, 11b. A region 12 comprising patterned thin film layers that may implement backside power distribution is shown. A sheet of thermal interface material (TIM) 13 is provided between region 12 and metal sheets such as 14. A gasket 15 with a backing plate 16 is provided for water sealing. Spring-loaded terminals (not shown) of socket 17 connect with corresponding conductive traces within RDL 6, and pins 18 of socket 17 connect with a motherboard 19.

Figure 2:
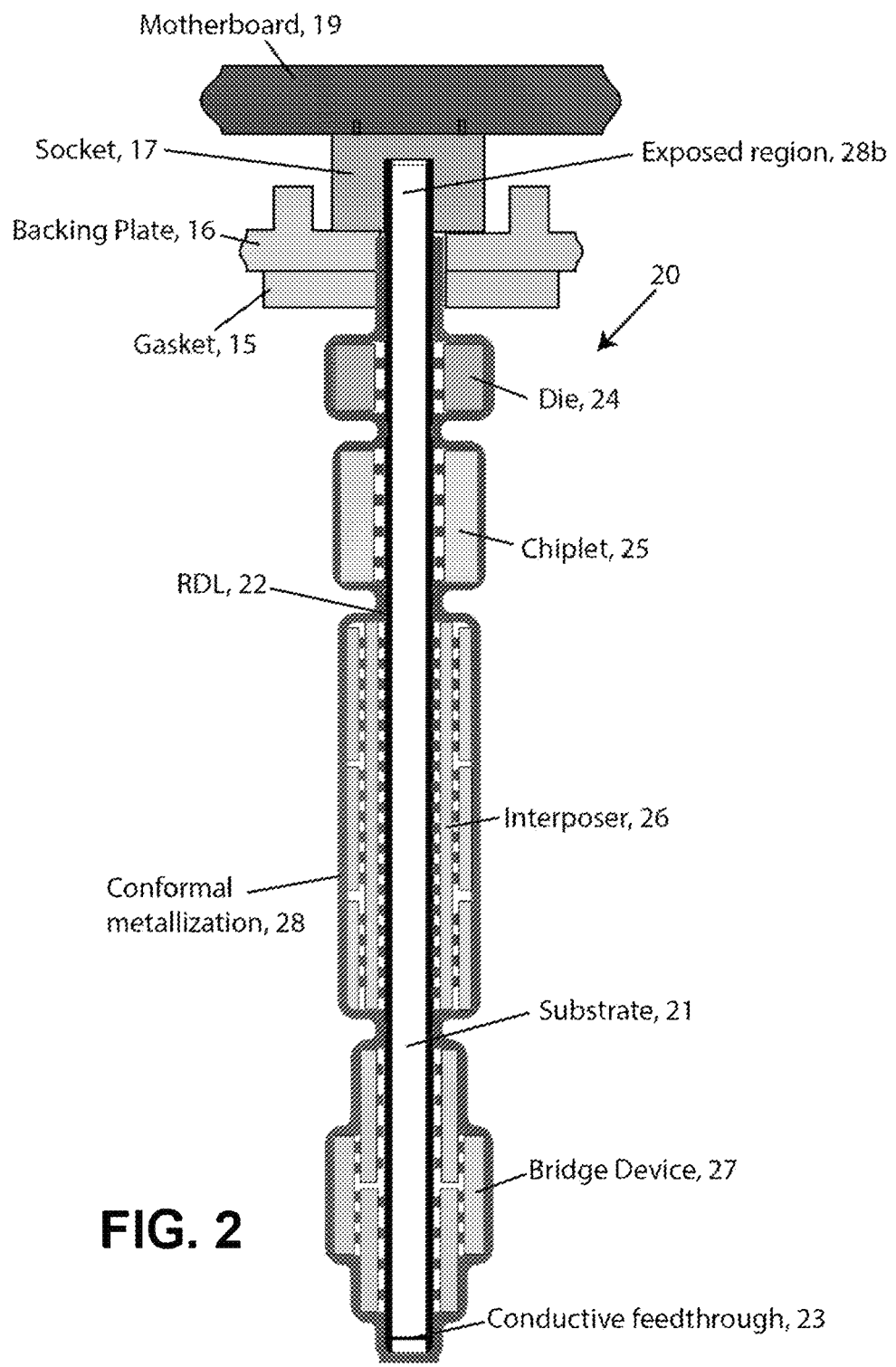
FIG. 2 illustrates a hermetic microelectronic module that employs a conformal metallization to create a hermetic electronic assembly, in an embodiment of the present disclosure.
Figure 3:
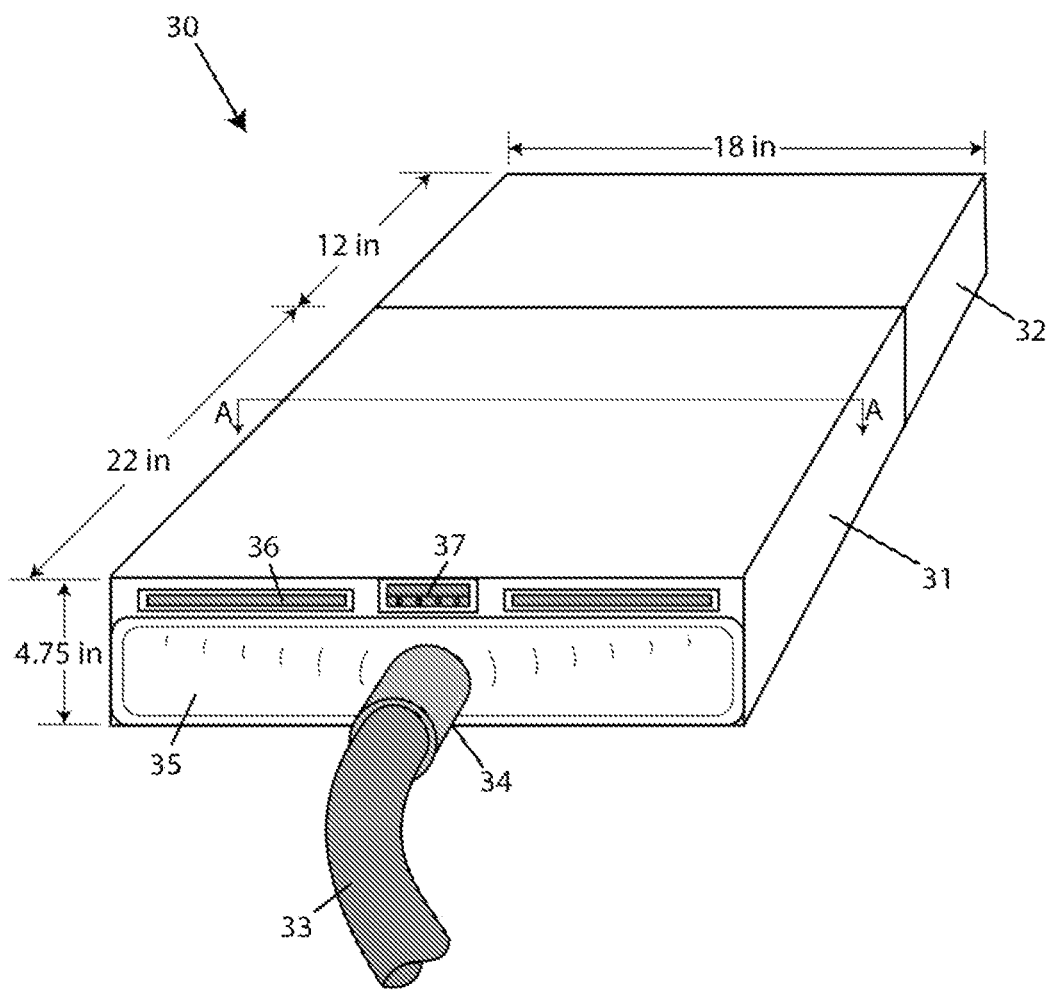
FIG. 3 illustrates a water-cooled server in an embodiment of the present disclosure.

FIG. 2 illustrates a hermetic microelectronic module 20 drawn from FIG. 3 of co-pending U.S. patent application Ser. No. 18/607,807; it includes new features or adaptations consistent with embodiments of the present disclosure. Gasket 15, backing plate 16, socket 17 and motherboard 19 are as described in reference to FIG. 1. Microelectronic module 20 includes substrate 21 which may be an organic glass-epoxy type substrate or a glass substrate or other type of ceramic substrate in different embodiments. Substrate 21 may include conductive feedthroughs 23. In an embodiment, a photo-sensitive glass substrate is used, and through glass vias (TGVs) are employed. Redistribution layers (RDLs) 22 comprise alternating conductive and dielectric thin film layers wherein selected conductive traces have a half-pitch of 2 μm or less, enabling component attachments using flip chip assembly wherein the pad pitch is 40 μm or less. Electronic components mounted on substrate 21 may include a semiconductor die 24, a chiplet 25, an interposer 26, or a bridge device 27 and other devices that are not shown, including chips, chips employing through-silicon vias (TSVs), surface mount devices, stacked devices, low-profile packaged devices, and thermal spacers. Embodiments include selections from logic chips, memory chips, optical and electro-optical chips, power conversion chips, voltage and current regulator chips, sensors, and passive devices. Stacked devices may include at least one memory chip and at least one logic chip in some embodiments. Thermal spacers may comprise blank silicon chips for example, providing a thermal path having a lower thermal resistance; alternatively, a thermally conductive filler may be employed.

In an embodiment, conformal metallization 28 comprises a layer of at least one of copper, nickel, chromium, titanium or gold or another metal known to have water impermeability at a thickness of 100 nm or greater, where the resultant hermeticity improves exponentially for each doubling of thickness. A more durable metallization having a thickness of 1-6 μm may be used. For creating electrical isolation prior to applying conformal metallization 28 the underlying substrate may be coated with a dielectric material such as Parylene C. Conformal metallization 28 may be applied by sputtering or evaporation in a vacuum chamber. In another embodiment conformal metallization 28 comprises a metal layer applied by electroless deposition; this layer may comprise copper or nickel as examples. It may be beneficial to create strong adhesion of conformal metallization 28 to the underlying circuit assembly. Accordingly, as each additional layer is deposited, including the first layer that may be an electroless deposition, the application process may include a surface activation to improve adhesion. The surface activation may be described as a pre-coating treatment; it may comprise a plasma treatment involving a low pressure gas such as oxygen that is ionized to form reactive ions and radicals that impact the surface and create dangling covalent bonds. Alternatively, surface activation may comprise a corona involving a high-voltage discharge in air. As a further alternative, surface activation may expose the surface to ultraviolet light in the presence of ozone, to create highly reactive oxygen radicals that break surface bonds. An electroless deposition may be further plated up using additional metal layers that are electro-deposited. In another embodiment one or more layers of metal is combined with one or more layers deposited using atomic layer deposition (ALD); in particular, ALDs of titanium oxide and aluminum oxide are known to provide substantial water barriers as well as electrical isolation. The ALDs may be configured as one or more diads, each diad comprising a pair of metal oxides.

Conformal metallization 28 encloses hermetic microelectronic module 20 except for an opening at the top where the metallization is not present so that electrical connections can be made between conductive traces within RDL 22 and spring-loaded terminals of socket 17.

In an embodiment electronic components mounted on substrate 21 are arranged in tiles. At least some of the tiles may comprise independently operable clusters of components. In an embodiment, a subset of the electronic components comprises redundant components, and means is provided to replace failed or failing components with selected ones of the redundant components; the means may include a test/monitor chip that continually monitors the health of mounted components, a power distribution chip for switching power on or off for selected components, and a processor executing instructions contained in memory for working in cooperation with the test/monitor chips and the power distribution chips to control the switching of components between active and non-active states. In an embodiment, by combining tile configurations with redundancy, agile reconfiguration of components within a hermetic microelectronic module 20 is enabled. Workload adaptability is also enabled in an embodiment comprising both redundancy and independently operable tiles. For example, for executing a computer program directed at an artificial intelligence (AI) application, different subsets of special-purpose tiles may be invoked, sequentially or simultaneously, to execute training, analysis, and inference operations. Such an adaptive approach will be higher-performing at a lower cost than a system having more rigid hardware configurations.

FIG. 3 illustrates a computer server 30 drawn from FIG. 1 of co-pending U.S. patent application Ser. No. 18/607,807; it includes new features or adaptations consistent with embodiments of the present disclosure. Dimensions are shown for server 30 to fit comfortably in a 3 U rack. Server 30 comprises a front section 31 wherein a densely packed array of hermetic microelectronic modules 20 is partially immersed in water. Rear section 32 is provided for making busbar connections at high levels of electrical power, for example over 2 MW of power at 650V and over 3,000 A. Server 30 includes an input of cooling water through hose 33 having an internal diameter of 2 inches. A similar hose is provided at the rear of server 30 (not shown) for carrying the output water, after it has absorbed heat generated by the hermetic microcomputer modules 20. Hose 33 couples to a water distribution plate 35 through hose coupling 34; it delivers cooling water at a rate of 200 gallons per minute in an embodiment. Hose coupling 34 may be a quick-connect coupling. At the front panel and/or the rear panel, electrical connectors 36 and optical connectors 37 are shown, for coupling input/output signals and power to server 30.

Figure 4:
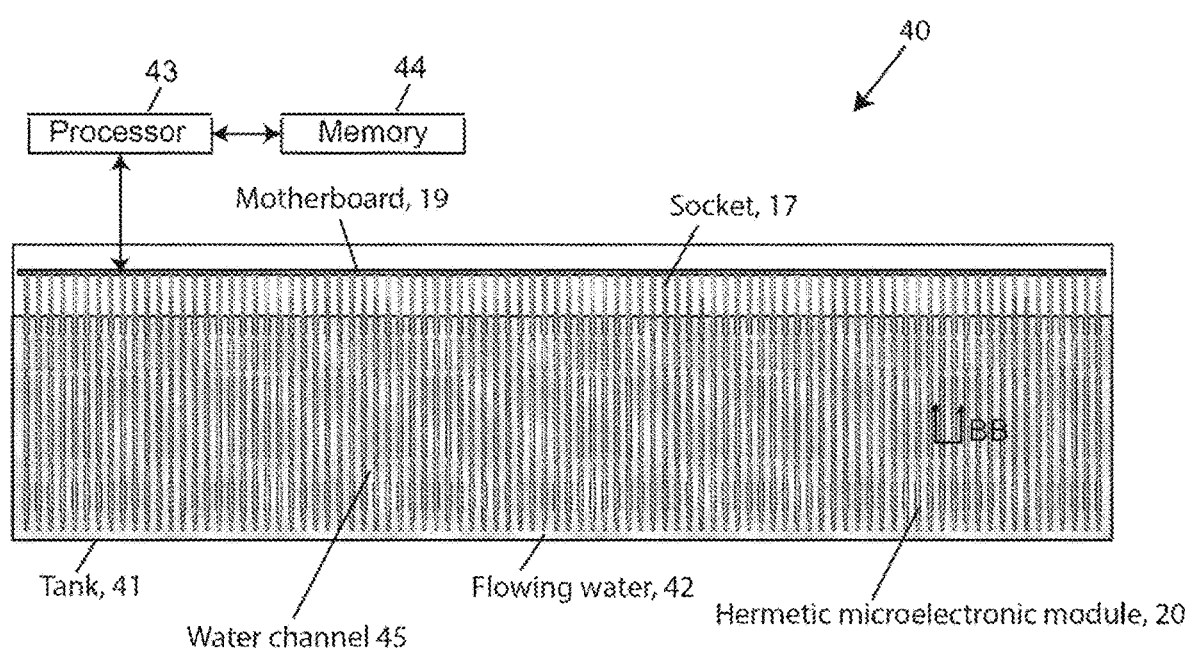
FIG. 4 illustrates a cross-section of the water-cooled server of FIG. 3, showing an array of hermetic microelectronic modules partially submerged in a tank of water, in an embodiment of the present disclosure.

FIG. 4 illustrates a cross-sectional view 40 of server 30, labeled AA in FIG. 3, again drawn from co-pending U.S. patent application Ser. No. 18/607,807; it includes new features or adaptations consistent with embodiments of the present disclosure. In an embodiment, 90 hermetic microelectronic modules 20 are arrayed across the width as shown in FIG. 4. Tank 41 is shown, partially filled with flowing water 42. Socket 17 and motherboard 19 are shown. Regularized structures are deployed in server 30, including the modules, many of which may be hardware identical except for optional reconfigurations that change which chips are active; the optional reconfigurations being under software control. System function is adaptable by workload via agile reconfigurations as previously described. The regularized structures are projected to be low in cost due to higher production volumes for the smaller number of components, as well as due to automation, wherein the repeated structures lend themselves to automated fabrication and assembly processes. Processor 43 and memory 44 may be deployed on motherboard 19 and are shown schematically; they are used for executing software to implement a hardware map comprising all the functional elements in the array of hermetic microelectronic modules 20, wherein processor 43 operates in cooperation with test/monitor chips and power distribution chips to execute switching of the functional elements between active and non-active states, to replace failed components with redundant components as required, and to adapt to the current workload demand.

Figure 5:
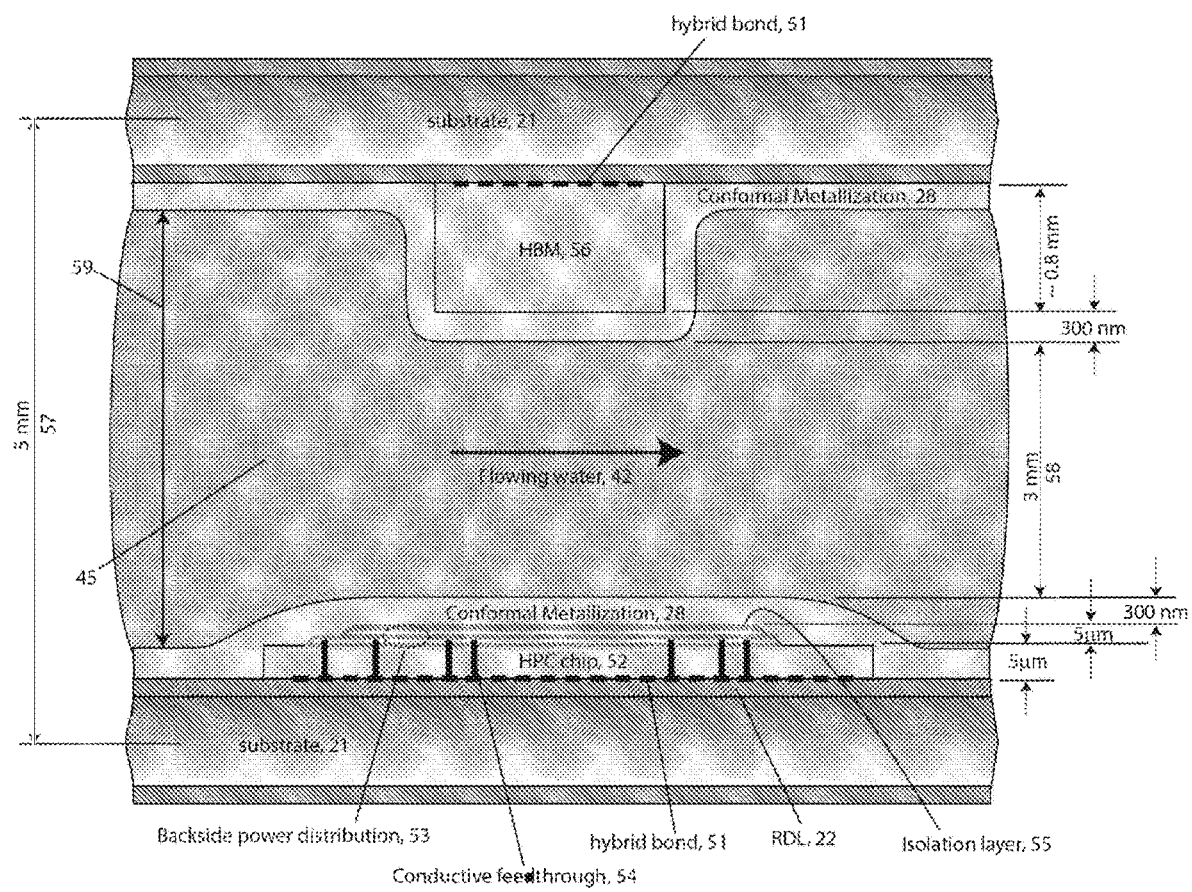
FIG. 5 illustrates an expanded cross-sectional view corresponding to section BB of FIG. 4 (rotated), in an embodiment of the present disclosure.

FIG. 5 illustrates an expanded and rotated cross-sectional view corresponding to section BB of FIG. 4, again drawn from co-pending U.S. patent application Ser. No. 18/607,708; it includes new features or adaptations consistent with embodiments of the present disclosure. The figure is not drawn to scale, but some approximate dimensions are shown for discussion purposes. Note that hybrid bonds 51 are employed rather than microbumps, although microbumps or other connectors may be used. Hybrid bonds are metal-to-metal bonds, with no gap between the mating members; they can be employed in advanced assembly processes to enable a pad pitch less than, for example, 10 µm.

In FIG. 5 a high-performance computing (HPC) chip 52, is hybrid bonded to substrate 21 via signal and power traces within RDL 22. The HPC chip may dissipate 700 W, for example, in the case of an Nvidia H100 chip. Chips having power dissipations up to 2,000 W may be used. HPC chip 52 may be thinned to around 5 µm to facilitate the fabrication of conductive feedthroughs 54. Power rails for VDD and VSS and potentially other voltages are patterned on the backside, together with dielectric layers, implementing backside power distribution 53. Isolation layer 55 is a dielectric layer providing electrical isolation from the conformal metallization 28; it may comprise Parylene C for example. As previously described, conformal metallization 28 may comprise a metal like copper, nickel, chromium, titanium, gold, or combinations thereof. A combination of metals and metal oxides may be used. The metal oxides may be applied using atomic layer deposition (ALD). In an embodiment a metallization having a total thickness in the range of 1-6 µm is used, sufficient thickness to provide a water-impermeable layer, while minimizing the thermal resistance between chip and water. A maximum water channel width 59 is shown. On the upper side of the water channel 45 a high-bandwidth memory (HBM) chip 56 is shown, having a height of around 0.8 mm. In an embodiment the spacing 57 between substrates 21 is around 5 mm and the unencumbered width 58 of water channel 45 is around 3 mm. The spacing 57 between substrates 21 may be in a range of 3-10 mm, and unencumbered channel width 58 may be in a range of 2-8 mm. Flowing water 42 is shown, wherein the water velocity is in the range of 0.1-2.0 meters per second in different embodiments.

Figure 6:
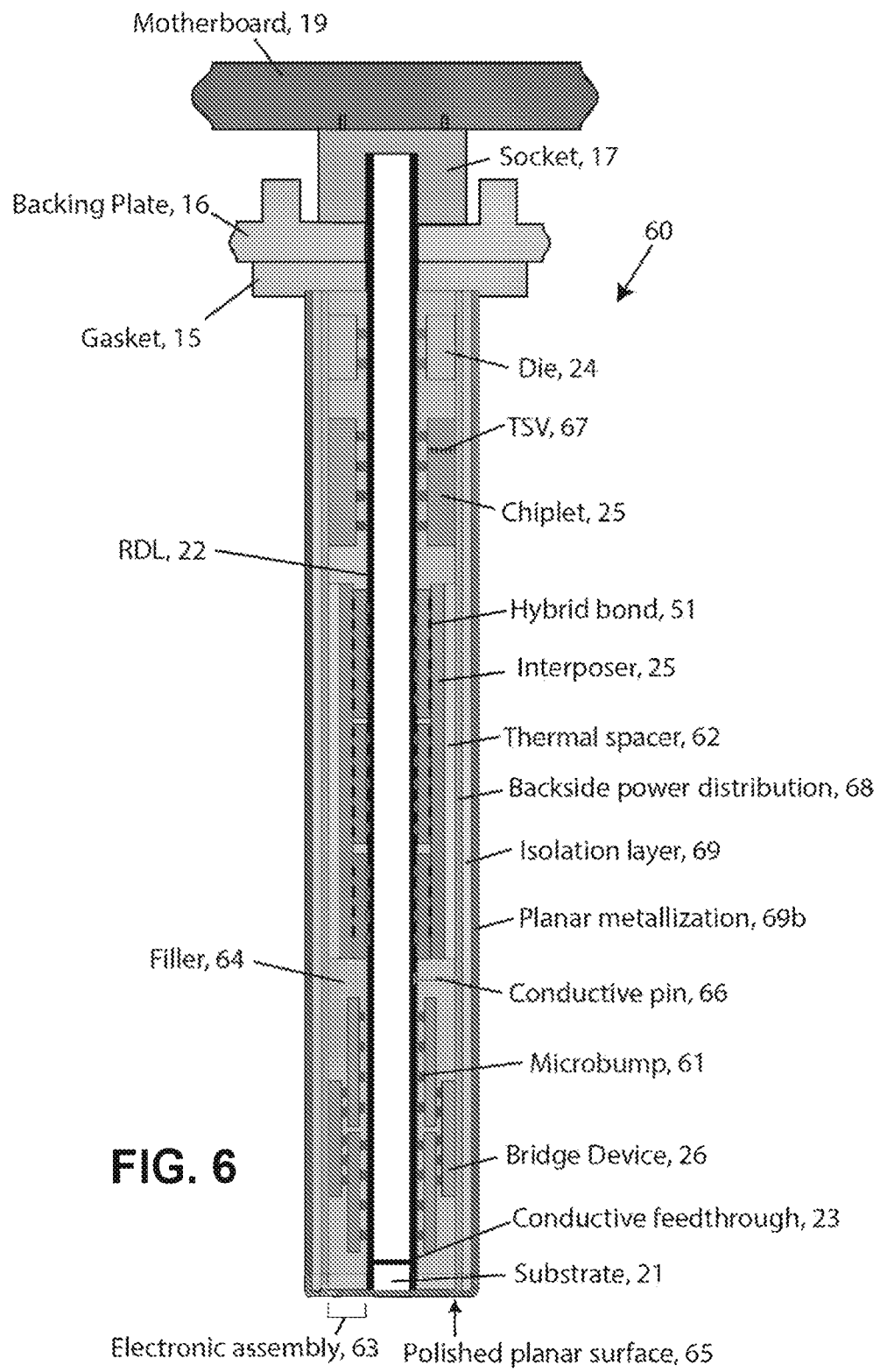
FIG. 6 illustrates an alternative hermetic microelectronic module that employs a planar metallization in an embodiment of the present disclosure that employs backside power distribution.
Figure 10:
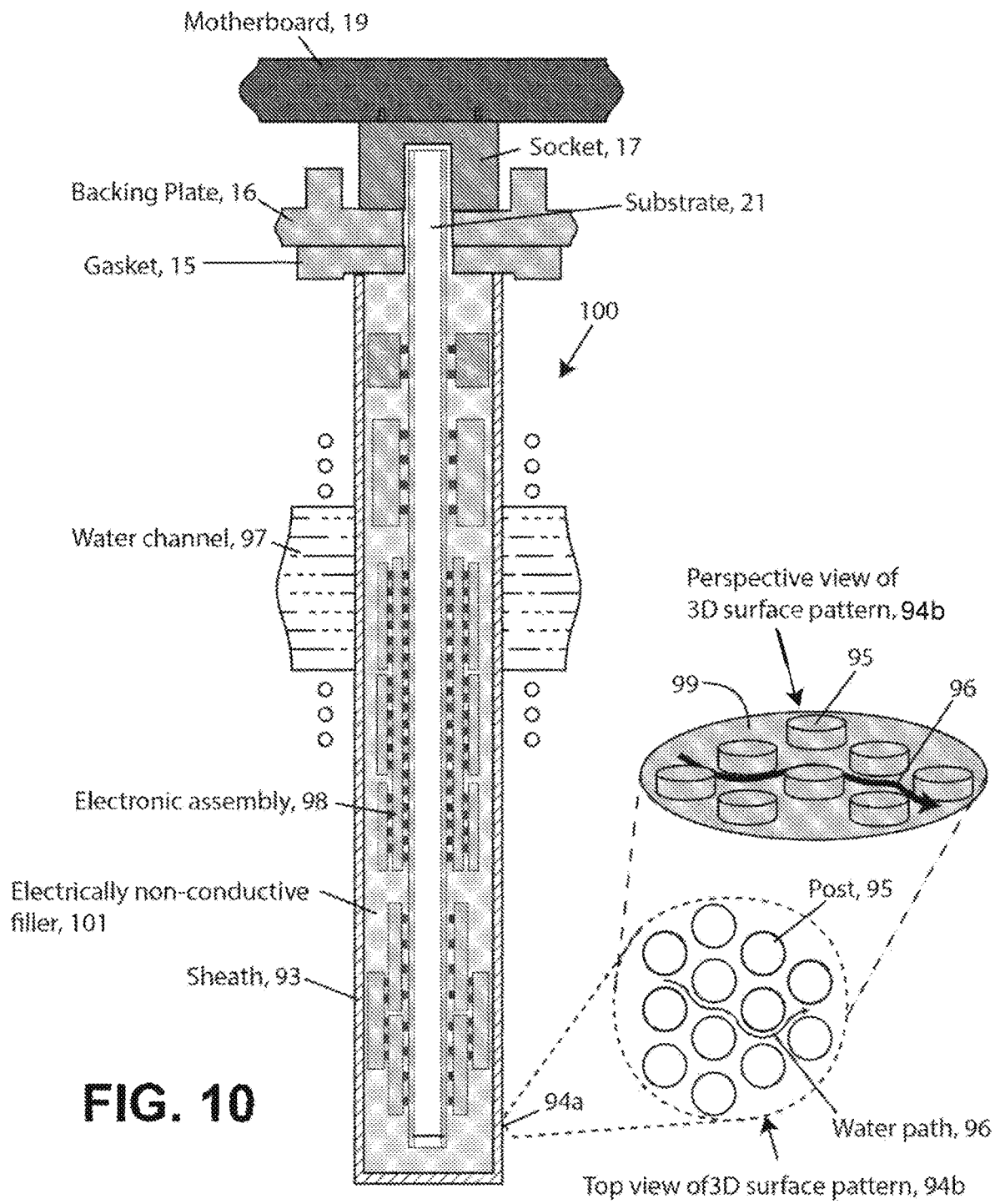
FIG. 10 is a schematic view of an alternative hermetic microelectronic module that comprises an electrically non-conductive filler, in an embodiment of the present disclosure.

FIG. 6 is a cross-sectional view of an alternative embodiment 60 of hermetic microelectronic module 20 drawn from FIG. 10 of co-pending U.S. patent application Ser. No. 17/982,393; it includes new features or adaptations consistent with embodiments of the present disclosure. For brevity, some elements of FIGS. 1 and 2 that are repeated in FIG. 6 are not re-described. A microbump 61 is shown, and a hybrid bond 51 is also shown; either bonding type may be used in electronic assembly 63. A thermal spacer 62 may be used to fill the gap when a chip or chip assembly has a height less than the height 63 of the electronic assembly. Since silicon is a good thermal conductor, a blank silicon chip can be sized to fit in the gap, thereby maintaining a low resistance in the thermal path between components of electronic assembly 63 and cooling water 42. In an embodiment filler 64 is used to fill gaps between components of each electronic assembly 63. The filler 64 can help stabilize the mounted components during grinding and polishing operations. The grinding and polishing operations may include chemical mechanical polishing (CMP). In an embodiment, a polished planar surface located at arrow 65 is produced from the grinding and polishing operations. An alternative method for planarizing electronic assembly 63 is described in reference to FIG. 7. Exemplary conductive feedthrough 23 is shown, connecting conductive elements disposed within RDLs 22 on each side of substrate 21. An exemplary through silicon via (TSV) 67 is shown, useful for connecting between conductive elements at the front side and the back side of a chiplet 25 for example. In an embodiment, a conductive pin or metal member 66 is used to provide a power feed between a conductive element disposed within RDL 22 and a power rail provided within backside power distribution 68. An isolation layer of dielectric material 69 is provided between conductors within backside power distribution 68 and planar metallization 69b; the dielectric material may be parylene C for example, although other dielectric materials such as silicon nitride or metal oxides or ceramics may be used. As described for conformal metallization 28, planar metallization 69b may comprise metal layers, and metal oxide layers deposited using ALD. Planar metallization 69b may be applied by a physical deposition process such as sputtering or evaporation, or by electroplating, or by combinations of these. Three-dimensional (3D) surface features may be patterned on planar metallization 69b to improve the convective heat transfer coefficient at the interface with flowing water 42. The 3D features may be patterned using, for example, conventional masking and etching processes.

Figure 7:
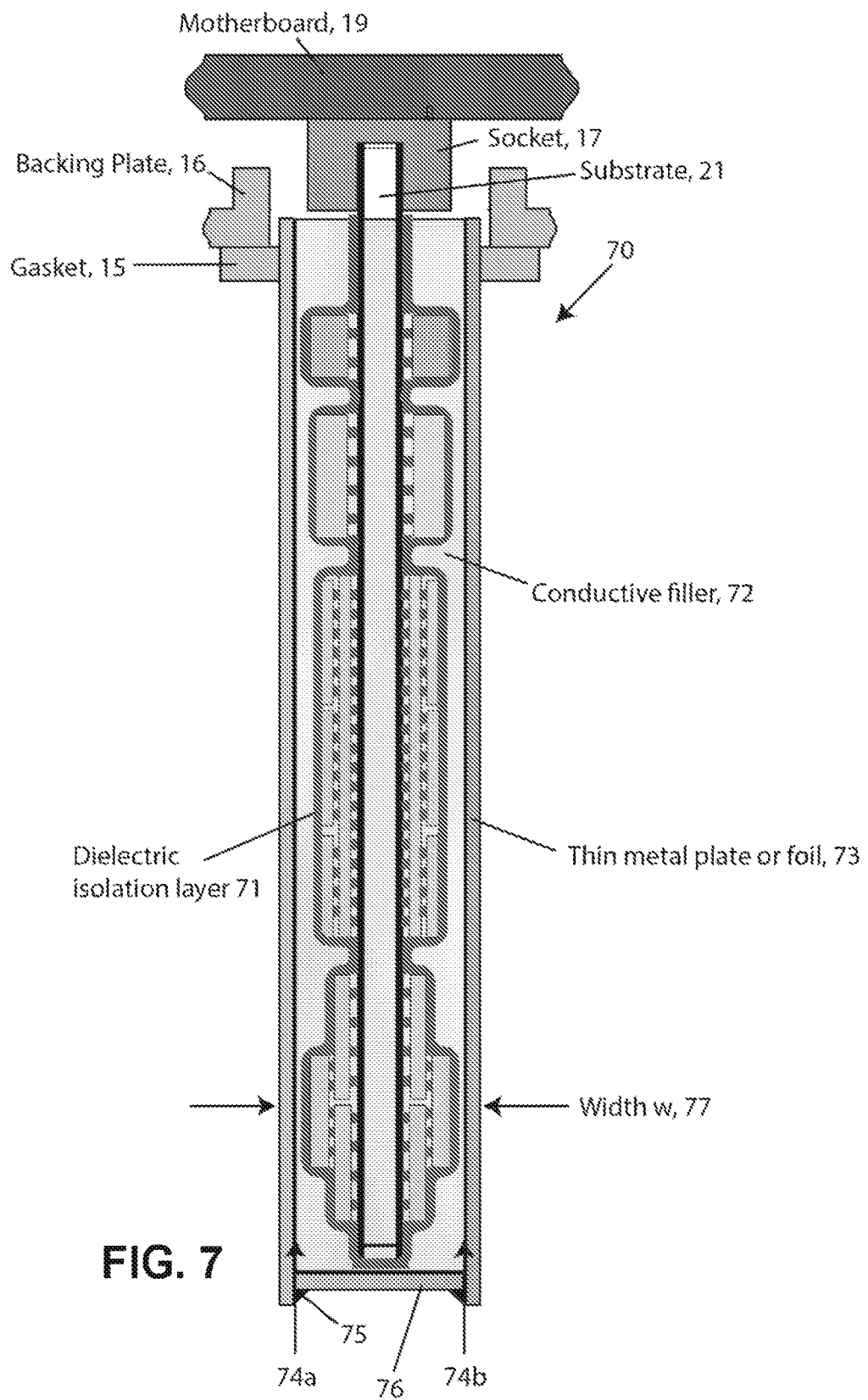
FIG. 7 is a cross-sectional view of an alternative microelectronic module that is planarized and encapsulated using a new method, in an embodiment of the present disclosure.

FIG. 7 is a cross-sectional view 70 of an alternative embodiment of hermetic microelectronic module 20. Since grinding and polishing equipment may not be available for creating a polished planar surface on a large circuit board, of a size such as, for example 22×5 inches, for use in a computer server such as server 30 described in reference to FIG. 3, a planarized circuit assembly may be alternatively produced using a press. The press may employ two thin metal plates 73, the same size as the circuit board, that are placed on either side of the board within a mold cavity. Electrically conductive filler 72 is injected into the mold cavity. Planar surfaces 74a, 74b of the molded filler material can be created, with or without the addition of thin metal plates 73. The metal plates 73 may be thin copper plates or foils for example. Pressure and heat are applied to create a desired width w, 77, for microelectronic module 70, and for curing the conductive filler. An alternative embodiment employs an electrically non-conductive filler and dielectric isolation layer 71 may not be required. If used, conductive filler 72 may be an epoxy filled with conductive particles for example. Alternatively, conductive filler 72 may be a compressible solid such as indium, having high thermal conductivity. As a further alternative, conductive filler 72 may comprise galinstan, an alloy of gallium, indium and tin, or another liquid metal composition. Hermetic microelectronic module 70 may be completed by soldering 75, a bottom plate 76, together with end plates (not shown) to the thin metal plates 73. An opening at the top of microelectronic module 70, free of thin metal plate or foil 73, is preserved for making electrical connections, such as via a socket 17 to a motherboard 19.

Figure 8:
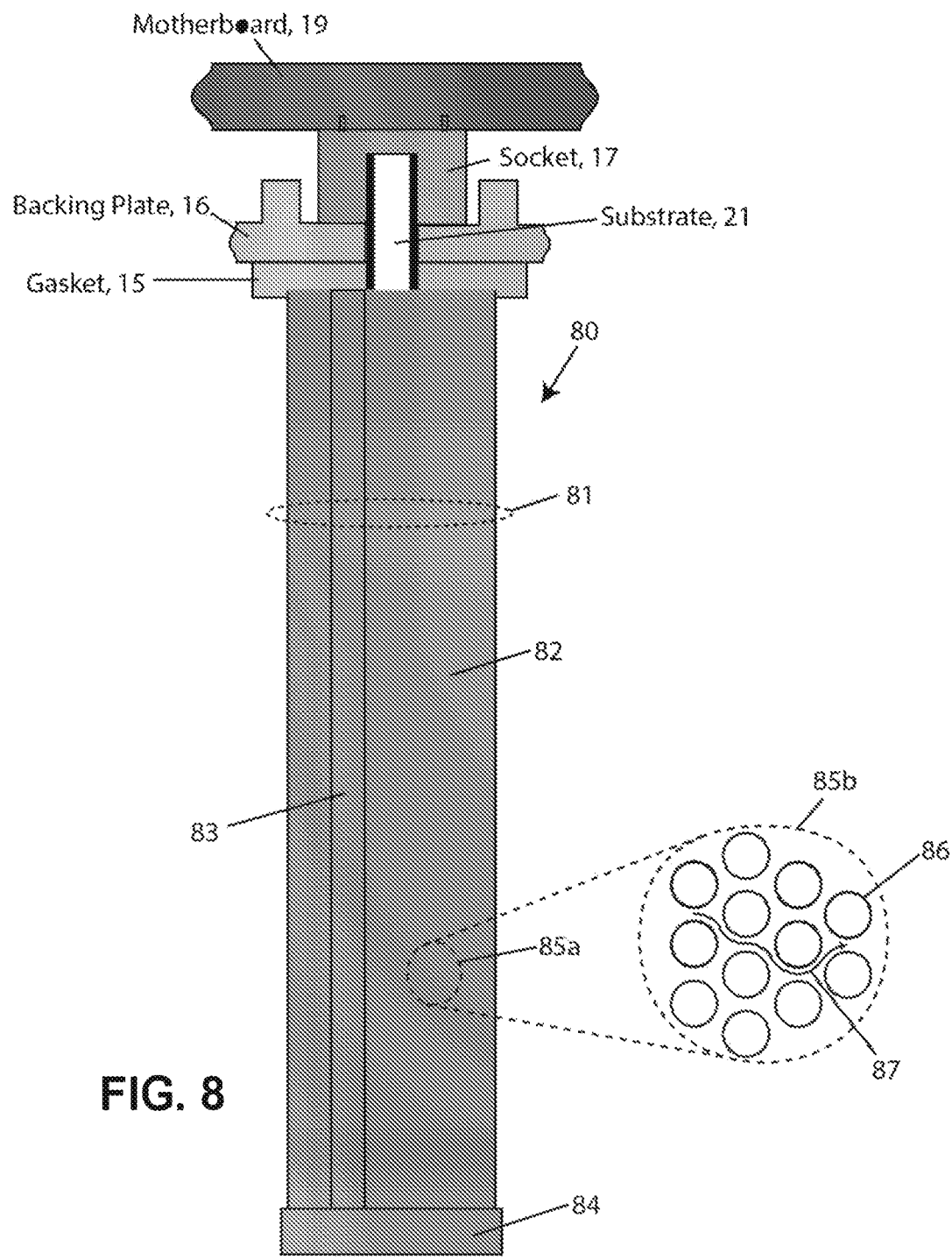
FIG. 8 is a schematic view of an alternative hermetic microelectronic module that employs a sheath comprising a wrapping of copper foil as the metallization, in an embodiment of the present disclosure.

FIG. 8 is a schematic view of another embodiment of a hermetic microelectronic module 80 in accordance with the present disclosure. Hermetic microelectronic module 80 includes a wrapping 81 of copper foil in place of conformal metallization 28 or planar metallization 69b. The copper foil 82 may have a thickness in the range of 1-20 mils, for example, and joints 83, 84 between edges of the wrapping may be sealed against water intrusion using solder for example. It will be appreciated that the thickness may be less than 1 or greater than 20 mils. Metal foils other than copper foils may be used. Advantages of this embodiment include durable handling and guaranteed hermeticity under a wide variety of operating conditions. The operating conditions may include chip temperatures up to 120° C. and water flow rates up to 2.0 meters per second for example. The copper foil may be patterned with three-dimensional (3D) features 85a, 85b, for improving the convective heat transfer coefficient at the interface with flowing water 42; an example of 3D features being copper posts 86 that interrupt the water flow 87, causing more direct impingement of cooling water at the water interface, and providing increased surface area. The copper foil, with or without 3D features, may be plated with nickel for corrosion resistance. For electrical isolation, a dielectric coating such as a coating of Parylene C may be provided underneath the copper foil; this coating may further comprise an adhesive for bonding the copper foil to the underlying surface. A thermal interface material (TIM) may be used in the gap between the copper foil and components of the underlying electronic assembly. The TIM may be a gallium-based liquid metal such as galinstan for example, providing a high thermal conductivity.

Figure 9:
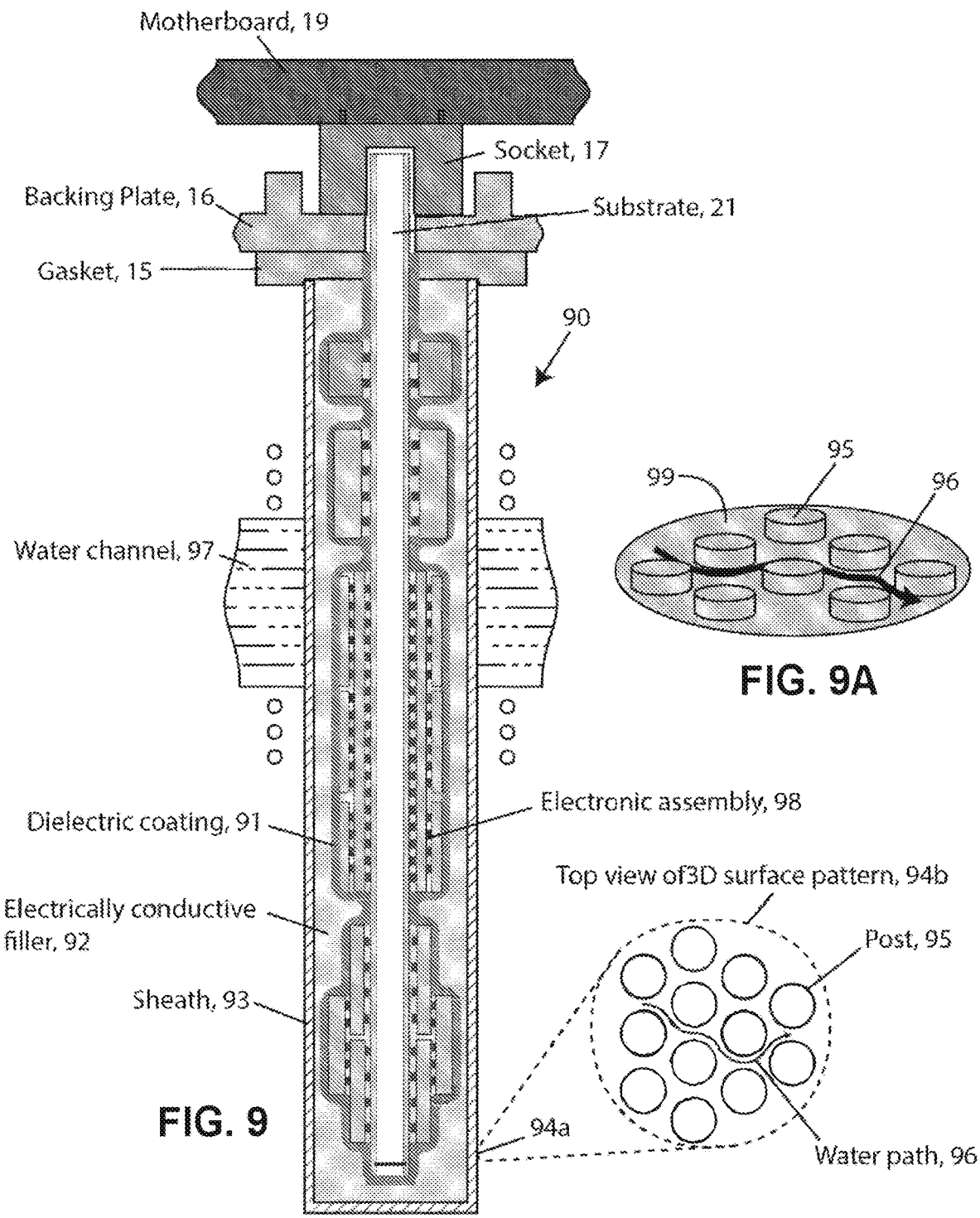
FIG. 9 is a schematic view of an alternative hermetic microelectronic module that employs a sheath comprising a metal casting, in an embodiment of the present disclosure.

FIG. 9 is a schematic view of a hermetic microelectronic module 90 in an alternative embodiment of the disclosure. Advantages include guaranteed hermiticity and durable handling properties. The hermetic microelectronic module 90 includes a sheath 93 comprising a metal casting in place of planar metallization 69b. Sheath 93 includes a base layer having a thickness of around 1 mm, sufficient to guarantee hermeticity. The casting may be fabricated as an investment casting with a dimensional accuracy of around 0.12 mm for example. This dimensional accuracy can allow electronic assembly 98 to be fitted inside sheath 93, wherein the gap between the highest component and the sheath is typically less than 0.2 mm. For low thermal resistance between the back face of components of the electronic assembly and cooling water, the gap between the components and the sheath is filled with a material having high thermal conductivity. The cast metal may comprise copper or nickel for example. For use with an electrically conductive filler material, electrical isolation of electronic assembly 98 may be created using a dielectric coating 91. Electrically conductive filler 92 is provided as shown. For the best thermal performance, a material of high thermal conductivity such as galinstan may be used.

When deployed in a computer server, for example, as described in reference to FIG. 4, hermetic microelectronic module 90 is surrounded by a water channel 97, like channel 45 depicted in FIGS. 4 and 5. As previously described in reference to FIG. 8, sheath 93 may optionally include 3D surface features, 94a, 94b, which may include an array of posts 95, causing the water to follow a serpentine or convoluted path such as water path 96, wherein multiple collisions or impingements of cooling water with the posts, along with an increase in surface area, lowers the convective heat transfer coefficient at the water interface and improves the cooling efficiency.

FIG. 9a is a perspective view of an exemplary 3D pattern comprising cylindrical posts 95 fabricated on a planar sheath surface 99, in an embodiment of the present disclosure. Other 3D surface patterns may be used, such as ribbed features, square posts, and the like. The patterned 3D surface may be produced using a monolithic casting for sheath 93, the posts could be plated onto planar sheath surface 99 using a masking process, or alternative techniques can be used to form the 3D surface patterns. Sheath surface 99, together with the 3D surface, may be plated with nickel to improve corrosion resistance.

An example of the efficacy of the 3D features follows. If the posts have, for example, a diameter of 1 mm and a height of 4 mm in a cell measuring 2.3×1.3 mm, the surface area is increased by a ratio of 8:49. Combining this increase in surface area with increased impingement of water with the sheath surface substantially increases the convective heat transfer coefficient at the water interface.

FIG. 10 is a schematic view of a hermetic microelectronic module 100 in an embodiment of the present disclosure. An electrically non-conductive filler 101 is used, and the dielectric coating 91 of FIG. 9 is not required providing at least a small gap is provided between the highest electronic component and the sheath. Alternatively, a dielectric coating, like coating 91 described in reference to FIG. 9 may be used, allowing direct contact between the component and the sheath. As previously described, electronic assembly 98 is fitted inside sheath 93. In an embodiment, electrically non-conductive filler 101 is injected into the cavity of sheath 93, surrounding the electronic components of assembly 98; the filler is subsequently cured. In an alternative embodiment a pre-molded assembly of electronic assembly 98 and filler 101 is inserted into the cavity of sheath 93, additional filler is injected into remaining gaps between the molded assembly and the sheath, and the combination is cured; in this case the additional filler may be filler 101 or may comprise a different filler material such as a liquid metal alloy. Advantages of these embodiments include durable handling and guaranteed hermeticity under a wide variety of operating conditions. The operating conditions may include chip temperatures up to 120° C. and water flow rates up to 2.0 meters per second for example. Non-conductive filler 101 may comprise aluminum nitride (AIN), a ceramic material such as A-01-F having a thermal conductivity of 180-200 W/mK and an electrical insulation of $10^{14}$ Ω/cm, produced by MARUWA CO., LTD. of Japan.

FIG. 13 illustrates the thermal performance of hermetic microelectronic module 100 described with reference to FIG. 10, for the case of cooling a high-performance computer (HPC) chip that dissipates 1,000W and has a chip area of 814 mm². A one-dimensional thermal analysis is used because the primary flow of heat is from the back face of the HPC chip to the cooling water, and secondary heat flows to the substrate and in lateral directions can be ignored, to a first approximation. The hermeticity of hermetic module 100 is guaranteed by the sheath which comprises a water-impermeable thickness of metal. Electrical shorts between mounted components and between components and the metal sheath are avoided because filler 101 is non-conductive electrically. Optionally, the substrate and the components may be coated with a dielectric layer prior to injecting the filler, to provide additional assurance against shorts. The total thermal resistance θ is 0.0131° C./W. θ comprises five thermal resistances in series: silicon of the HPC chip; an AlN filler from MARUWA, a base layer of a copper casting, a plated layer of nickel, and a thermal resistance at the water interface that is characterized by convective heat transfer coefficient, h. Coefficient h depends on flow velocity, surface geometry, and water properties that vary with temperature. In an embodiment, the flow velocity is 1-2 m/s, a velocity that will help to keep the posts clean due to the high flushing action, and a velocity that also contributes to a high value of h, i.e., forceful impingement of water on the pin surfaces contributes to high heat transfer. The temperature difference, ΔT, between junctions of an HPC chip dissipating 1,000 W and the cooling water is calculated as 13.1° C. As an example of a system implementation, a water-cooled system such as server 30 described in reference to FIG. 3, is provided with a water cooling loop having a cooled temperature of 10° C. and a maximum water-heated temperature of 65° C., created due to thermal dissipation of all the electronic components across a 22-inch long substrate of server 30. Accordingly, a maximum junction temperature of an HPC chip such as 52 described in reference to FIG. 5, would be calculated as 65+13.1=78.1° C. Heat spreading effects may reduce this maximum junction temperature if the chip layout on substrate 21 includes chips adjacent to the HPC chip having lower power dissipation. This example demonstrates a hermetic microelectronic module capable of efficiently cooling a heat flux greater than 1,000 W/cm² (10 W/mm²) at the back face of an HPC chip. Since modern HPC chips are typically specified to work with junction temperatures as high as 100° C., the lower junction temperature enabled by the present invention can lead to more efficient transistor operation that provides improved energy efficiency, and also leads to improved long-term reliability.

Figure 11:
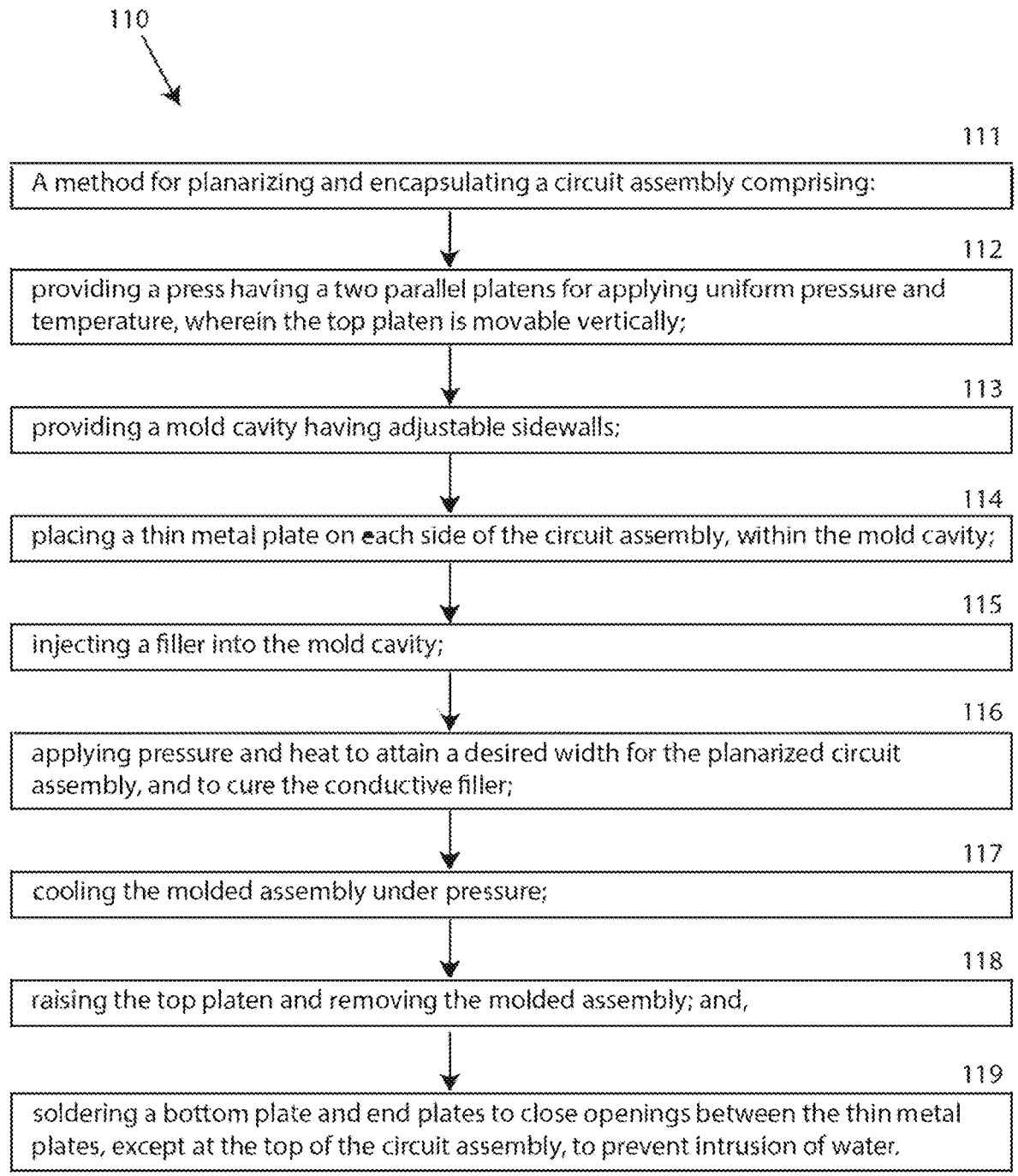
FIG. 11 is a flow chart presenting a method for planarizing and encapsulating a circuit assembly, in an embodiment of the present disclosure.

FIG. 11 is a flow chart of a method for planarizing and encapsulating a circuit assembly in an embodiment of the present disclosure. The method comprises: providing a press having two parallel platens for applying uniform pressure and temperature, wherein the top platen is movable vertically, step 112; providing a mold cavity having vertical sidewalls, step 113; placing a thin metal plate on each side of the circuit assembly, within the mold cavity, step 114; injecting a filler into the mold cavity, step 115; applying pressure and heat to attain a desired width for the planarized circuit assembly, and to cure the filler, step 116; cooling the molded assembly, step 117; raising the top platen and removing the molded assembly, step 118; and finally, soldering a bottom plate and end plates to close openings between the thin metal plates, except at the top of the circuit assembly, to create a hermetic module, step 119.

An alternative method for planarizing a circuit assembly comprises using a press to form a molding, wherein the filler is a thermally conductive material, and no metal plates are used. The molding can then be fitted inside the cavity of a sheath, as described in reference to FIGS. 9 and 10 for example.

Figure 12:
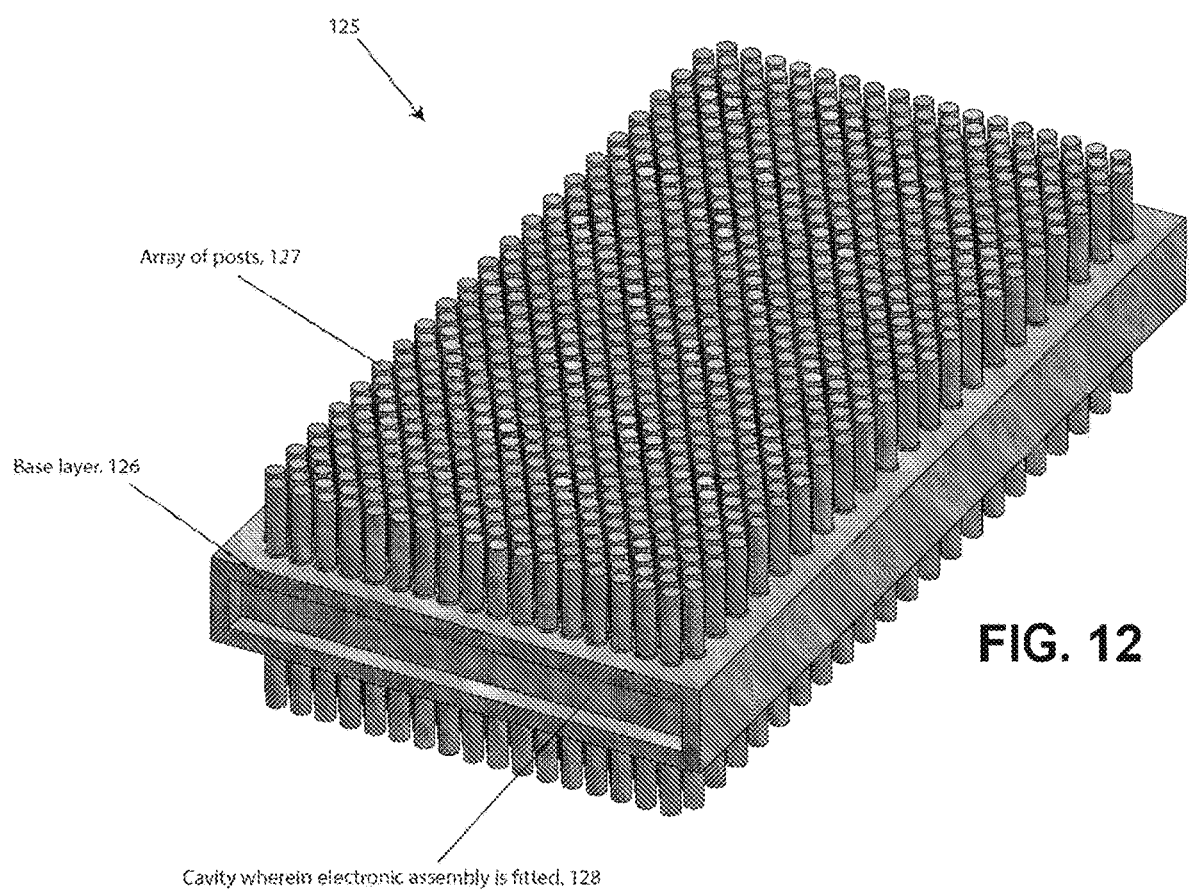
FIG. 12 is a perspective view of an exemplary investment casting, in an embodiment of the present disclosure.

FIG. 12 illustrates an exemplary investment casting 125 in an embodiment of the present disclosure. Casting 125 is of small size for discussion purposes. The posts have a diameter of 1 mm and a height of 4 mm in this example. Casting 125 includes a base layer 126 and an array of posts 127 formed on the external surface of the base layer. Cavity 128 is provided for fitting an electronic assembly inside, such as electronic assembly 98 depicted in FIG. 10. Investment casting 125 may have a dimensional tolerance of around 0.12 mm; this enables the electronic assembly to be fitted inside, with only a small gap of around 0.2 mm between the highest electronic component and the inner surface of the base layer. The small gap enables a low thermal resistance in the path between the electronic component and cooling water.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. For example, all embodiments described herein can be adapted to work with the thin metal plate or foil 73, the copper wrapping 81, or the sheath 93. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, the teachings may be applied to other water-cooled electronic systems, especially those with space limitations or aggressive cooling requirements. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A hermetic microelectronic module comprising:
   a substrate including redistribution layers (RDLs) fabricated thereon;
   a plurality of electronic components mounted on the substrate to create an electronic assembly; and
   a stand-alone metal sheath, the electronic assembly fit inside the stand-alone metal sheath to enclose the electronic assembly on all sides except for an opening at the top for making electrical connections, a portion of the substrate extending through the opening and including conductive traces; and
   a socket electrically connectable with the conductive traces, the socket configured to electrically connect to a motherboard.

2. The hermetic microelectronic module of claim 1 wherein the plurality of electronic components is selected from chips, chips employing through-silicon vias (TSVs), chiplets, surface mount devices, stacked devices, low-profile packaged devices, and thermal spacers.

3. The hermetic microelectronic module of claim 2 wherein the stacked devices comprise an interposer, a bridge device, or a stacked device comprising at least one memory chip and at least one logic chip.

4. The hermetic microelectronic module of claim 1 wherein the plurality of electronic components comprises a selection from logic chips, memory chips, optical and electro-optical chips, power conversion chips, voltage and current regulator chips, sensors, passive devices, and redundant copies of selected components.

5. The hermetic microelectronic module of claim 1 wherein the stand-alone metal sheath comprises copper.

6. The hermetic microelectronic module of claim 5 wherein the stand-alone metal sheath comprises nickel.

7. The hermetic microelectronic module of claim 1 wherein the stand-alone metal sheath comprises a casting.

8. The hermetic microelectronic module of claim 1 wherein the outer surface of the stand-alone metal sheath comprises a 3D pattern.

9. The hermetic microelectronic module of claim 8 wherein the 3D pattern comprises an array of posts.

10. The hermetic microelectronic module of claim 1 wherein the stand-alone metal sheath is fitted over the electronic assembly with a gap between the highest component and the stand-alone metal sheath measuring less than 0.2 mm.

11. The hermetic microelectronic module of claim 10 wherein the gap is filled with a thermal interface material.

12. The hermetic microelectronic module of claim 11 wherein the thermal interface material comprises an electrically conductive material.

13. The hermetic microelectronic module of claim 11 wherein the thermal interface material comprises a liquid metal or metal alloy.

14. The hermetic microelectronic module of claim 11 wherein the thermal interface material comprises an electrically non-conductive material.

15. A computer server comprising:
    a tank partially filled with water,
    a plurality of hermetic microelectronic modules partially immersed in the tank, wherein each of the plurality of hermetic microelectronic modules comprises:
      a substrate including redistribution layers (RDLs) fabricated thereon;
      a plurality of electronic components mounted on the substrate to create an electronic assembly; and,
    a stand-alone metal sheath, the electronic assembly fit inside the stand-alone metal sheath to enclose the electronic assembly on all sides except for an opening at the top for making electrical connections, a portion of the substrate extending through the opening and including conductive traces; and
    a socket electrically connectable with the conductive traces, the socket configured to electrically connect to a motherboard.

16. The hermetic microelectronic module of claim 1, wherein the stand-alone metal sheath has a thickness of 1 mm.

17. The computer server of claim 15, wherein the stand-alone metal sheath has a thickness of 1 mm.

18. The hermetic microelectronic module of claim 1, further comprising:
    a gasket disposed over the opening and around the portion of the substrate extending through the opening; and
    a backing plate disposed over the gasket for compressing the gasket to facilitate a seal between the gasket and the stand-alone metal sheath.

19. The hermetic microelectronic module of claim 15, further comprising:
    a gasket disposed over the opening and around the portion of the substrate extending through the opening; and
    a backing plate disposed over the gasket for compressing the gasket to facilitate a seal between the gasket and the stand-alone metal sheath.

* * * * *